(12) United States Patent
Brambilla et al.

(10) Patent No.: US 6,384,645 B2
(45) Date of Patent: May 7, 2002

(54) INTEGRATED GENERATOR OF A SLOW VOLTAGE RAMP

(75) Inventors: Davide Brambilla, Rho; Mauro Cleris, Bareggio, both of (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/824,534

(22) Filed: Apr. 2, 2001

(30) Foreign Application Priority Data

Mar. 31, 2000 (EP) ............................................. 00830249

(51) Int. Cl.[7] ................................................. H03K 4/06
(52) U.S. Cl. ....................................... 327/137; 327/131
(58) Field of Search ................................ 327/131, 132, 327/134, 137, 140, 103

(56) References Cited

U.S. PATENT DOCUMENTS

| | | | |
|---|---|---|---|
| 3,893,036 A | | 7/1975 | Cavoretto et al. ........... 328/185 |
| 4,017,747 A | | 4/1977 | Sheng ........................ 307/293 |
| 4,268,794 A | * | 5/1981 | Handte et al. .............. 327/131 |
| 4,285,051 A | | 8/1981 | Henneuse ..................... 365/45 |
| 5,387,882 A | * | 2/1995 | Schoofs ...................... 327/131 |
| 5,502,410 A | * | 3/1996 | Dunn et al. ................. 327/103 |
| 5,642,066 A | * | 6/1997 | Burke ......................... 327/137 |
| 6,169,433 B1 | * | 1/2001 | Farrenkopf ................. 327/131 |

FOREIGN PATENT DOCUMENTS

EP 0 113 590 7/1984 .......... H03K/3/023

OTHER PUBLICATIONS

Matsumoto et al: "A Comparator–based Switched–Capacitor Voltage–to–Frequency Converter", vol. E73, No. 1, 1990, pp. 138–139.

* cited by examiner

*Primary Examiner*—Toan Tran
(74) *Attorney, Agent, or Firm*—Lisa K. Jorgenson; Allen, Dyer, Doppelt, Milbrath & Gilchrist, P.A.

(57) ABSTRACT

An integrated circuit for producing a small slope voltage ramp includes a circuit for generating a periodic triangular current signal, and a circuit for generating, at the beginning of each period of the triangular signal, a pulse of a certain duration which is much smaller than the period of the triangular signal. A control loop is input at a node with the triangular current signal and produces the desired slow voltage ramp on the output node. The control loop includes a first hold circuit coupled to the input node via a first switch controlled by the pulse, and a transconductance operational amplifier, whose inputs are respectively coupled to the input node and to the output node. Also, the control loop includes a second hold circuit coupled to the output of the operational transconductance amplifier via a second switch controlled in a complementary manner with respect to the first switch. A resistor of a much smaller value than the ratio between the period of the triangular signal and the capacitance of the storage capacitor of the first hold circuit is connected between the output of the second hold circuit and the input node.

20 Claims, 3 Drawing Sheets

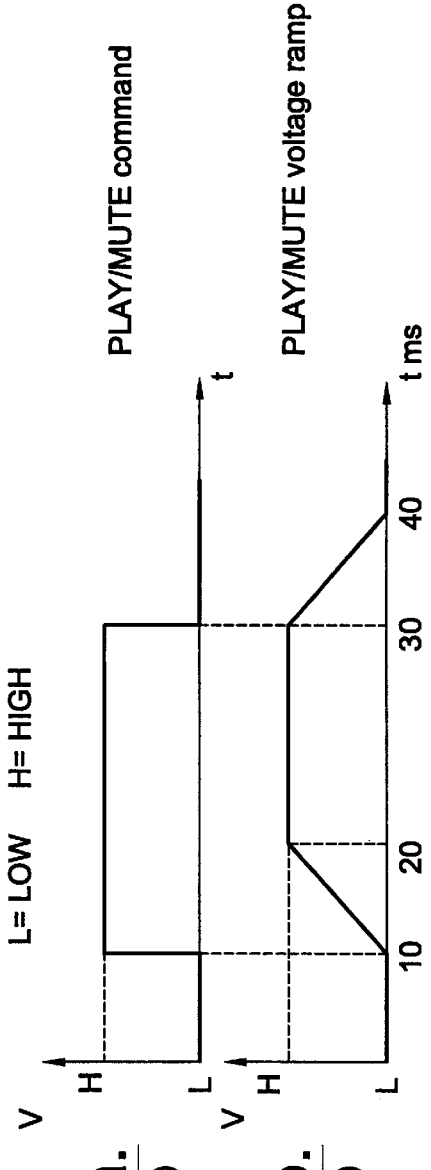
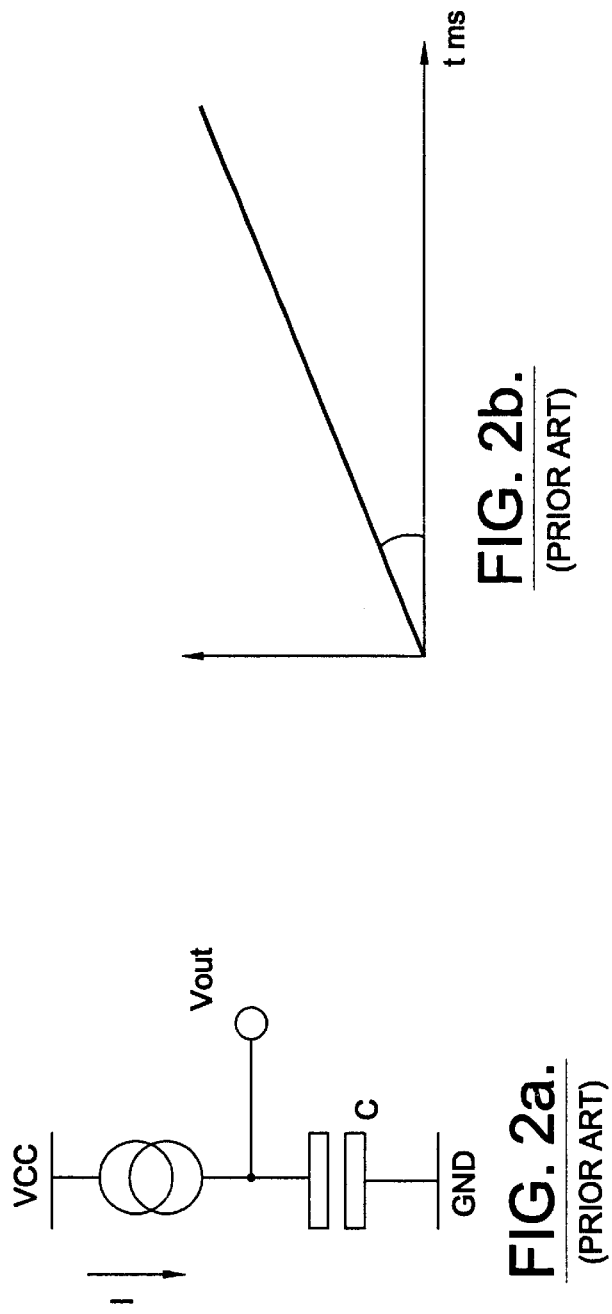

US 6,384,645 B2

INTEGRATED GENERATOR OF A SLOW VOLTAGE RAMP

FIELD OF THE INVENTION

The present invention relates to the field of integrated circuits, and, more particularly, to an integrated voltage generator for generating a voltage ramp with a relatively small slope.

BACKGROUND OF THE INVENTION

The increasing number of functions implemented in an integrated circuit, with the consequent reduction of the number of available pins, leads to the development of circuits requiring fewer and fewer external components. A function difficult to implement in a fully integrated form is the generation of voltage ramps with relatively small slopes, for example, on the order of several hundreds of milliseconds. Such voltage ramps are used as start-up ramps in various devices, e.g. in devices for audio applications, to slow down the transitions from the MUTE condition to the PLAY condition and vice versa.

For audio applications, at the assertion of a MUTE/PLAY transition, it is necessary to generate a voltage ramp with a positive slope, as indicated in FIG. 1, while in the case of switching from PLAY to MUTE it is necessary to generate a voltage ramp with a negative slope. Such a slow voltage ramp allows gradual transitions between the two operating conditions.

Conceptually, voltage ramps can be generated by forcing a charge current on a capacitor and outputting the voltage produced on it, as illustrated in FIG. 2. In integrated circuits, the generation of voltage ramps lasting one hundred milliseconds and over poses problems, because large capacitances, which are difficult to integrate, are needed.

For example, if a voltage ramp switching from a 0V to a voltage of 5V in a time of 10 milliseconds or even in a longer time is required, as frequently required in audio applications, the current generator I of FIG. 2 should force a current lower than 50 nA in the capacitor C. But, due to silicon area requirements and the corresponding costs, the integration of capacitances greater than 100 pF is too expensive.

Generation of such small currents which are compensated for the process spread and for temperature variations is very difficult, making devices of the desired precision and reliability hardly feasible. A way to avoid such a problem is to use external capacitors, but this gives up the advantages of a fully integrated approach. Drawbacks of the known approaches are either relatively complex hardware and software, a greater number of external components, an increment of cost and an intrinsic reduction of reliability of the system.

SUMMARY OF THE INVENTION

It is an object of the present invention to provide a fully integrated circuit for producing a slow voltage ramp with a precisely controllable relatively small positive or negative slope. The circuit of the invention produces a polylinear output voltage that can be approximated to a linear voltage ramp, using a generator of a voltage ramp with a relatively steeper slope.

More precisely, the invention includes an integrated circuit for producing a voltage ramp with a small slope. The integrated circuit includes a circuit for generating a periodic triangular current signal, and a circuit for generating, at the beginning of each period of the triangular signal, a pulse of a certain duration much smaller than the period of the triangular signal. Also, the integrated circuit includes a feedback loop input with the triangular signal and producing the slow voltage ramp on the output node while being controlled by the pulse.

The feedback loop comprises a first hold circuit coupled to the input node through a first switch controlled by the pulse, for producing the voltage ramp on an output node. Also included are a transconductance operational amplifier, whose inputs are respectively coupled to the input terminal and to the output node, a second hold circuit coupled to the output of the transconductance amplifier through a second switch controlled in phase opposition of the first switch, and a resistor of a relatively small value compared to the ratio between the period of the first triangular signal and the capacitance of the storage capacitor of the first hold circuit, which is connected between the output of the second hold circuit and the input node.

BRIEF DESCRIPTION OF THE DRAWINGS

The different aspects and advantages of the invention will become clear through the following detailed description of an embodiment of the invention and by referring to the attached drawings.

FIGS. 1a and 1b are timing diagrams illustrating the control signal PLAY/MUTE and the respective voltage ramp as in the prior art.

FIG. 2a is a diagram of a generator of a linear voltage ramp as in the prior art.

FIG. 2b is a timing diagram illustrating the linear voltage ramp of the generator of FIG. 2a.

DETAILED DESCRIPTION OF THE PREFERRED EMBODIMENTS

The fully integrated circuit of the invention produces a slow voltage ramp with a controllable positive or negative slope. It can be input with the command of generating a voltage ramp with a positive or negative slope, through a dedicated pin of the integrated circuit or by way of a serial bus. The circuit produces voltage ramps that may last even several hundreds of milliseconds without requiring the use of capacitors of large capacitance which would be impractical to integrate.

Figure 3:
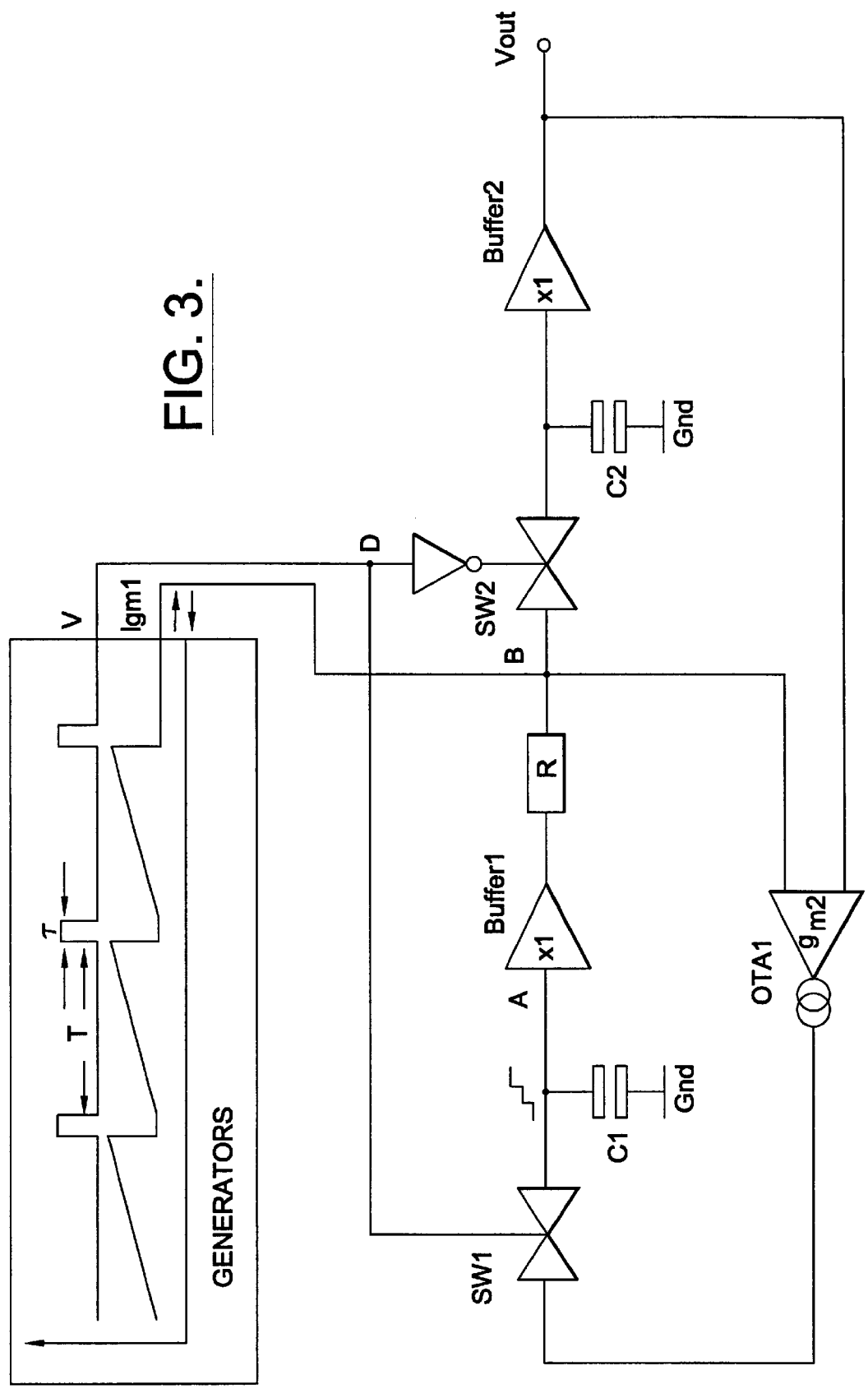
FIG. 3 is a schematic diagram illustrating the circuit in accordance with the invention.

A basic diagram of the circuit of the invention is depicted in FIG. 3. It includes a first block GENERATORS producing a triangular current ramp with a relatively steep slope and a voltage pulse V. A control loop is on the input node B of which the triangular current ramp $I_{GM_1}$ is injected, and on an output node of which the slow voltage ramp $V_{OUT}$ is produced. The loop includes a first hold circuit, typically formed of a storage capacitor C2 and a buffer Buffer2, coupled to the input node B via the switch SW2, that outputs the slow voltage ramp $V_{OUT}$. A transconductance operational amplifier OTA1 functionally coupled to the output ($V_{OUT}$) is fed back through a second hold circuit, which, in turn, includes a storage capacitor C1 that is coupled to the output of the operational amplifier OTA1 through the switch SW1, a buffer Buffer1 and a resistor R connected between the output node of the buffer Buffer1 and the input node B. The two switches SW1 and SW2 are controlled in a direct and in a complemented way by the voltage pulse V.

The block GENERATORS produces a sawtooth current signal $I_{GM1}$ whose period may range from about 50 ms to 5 ms and over and a voltage pulse V lasting τ seconds at the beginning of each period of $I_{GM1}$. The current ramp $I_{GM1}$ can be either positive or negative, for producing rising or falling output voltage ramps. The pulses duration τ must be much smaller than the time interval T between a pulse and the successive one, for example τ<T/100.

During the duration τ of the pulse V, the switch SW2 is off and the first hold circuit (C2, Buffer2) produces a constant voltage $V_{OUT}$, while the switch SW1 is conductive. Therefore the capacitor C1 charges as long as the voltage present on the input node B reaches the output voltage $V_{OUT}$ because of the second hold circuit (C1, Buffer1) and the resistance R. During the interval T, the switch SW2 is conductive while SW1 is off. Therefore the resistance R is connected in parallel to the capacitor C2. If the time constant of the parallel combination of R and C2 is much smaller than T, i.e. R·C2<<T, the voltage on the capacitor C2, that is output by Buffer2, varies proportionally to the current $I_{GM1}$, thus producing on the output a first stroke of the desired slow voltage ramp.

The above process repeats itself many times during each cycle thus generating a voltage $V_{OUT}$ having the polylinear trend described by the following equations:

$$V_{OUT}(t)=V_{OUT}(n \cdot (T+\tau))+K \cdot I_{GM1}(t) \text{ with } n \cdot (T+\tau)<t \leq (n+1) \cdot T+n \cdot \tau$$

$$V_{OUT}(t)=V_{OUT}((n+1) \cdot T+n \cdot \tau) \text{ with } (n+1) \cdot T+n \cdot \tau<t \leq (n+1) \cdot (T+\tau)$$

wherein n is a natural number and K is a coefficient that depends on the resistance value R. Such a trend approximates a linear voltage ramp if the above mentioned conditions are verified:

$$\begin{cases} \tau << T \\ R \cdot C2 << T \end{cases}$$

As it may be readily noticed, using an easily integratable generator of a current ramp $I_{GM1}$ with positive or negative slope, it is possible to produce a relatively slow voltage ramp with positive or negative slope, respectively.

Figure 4:
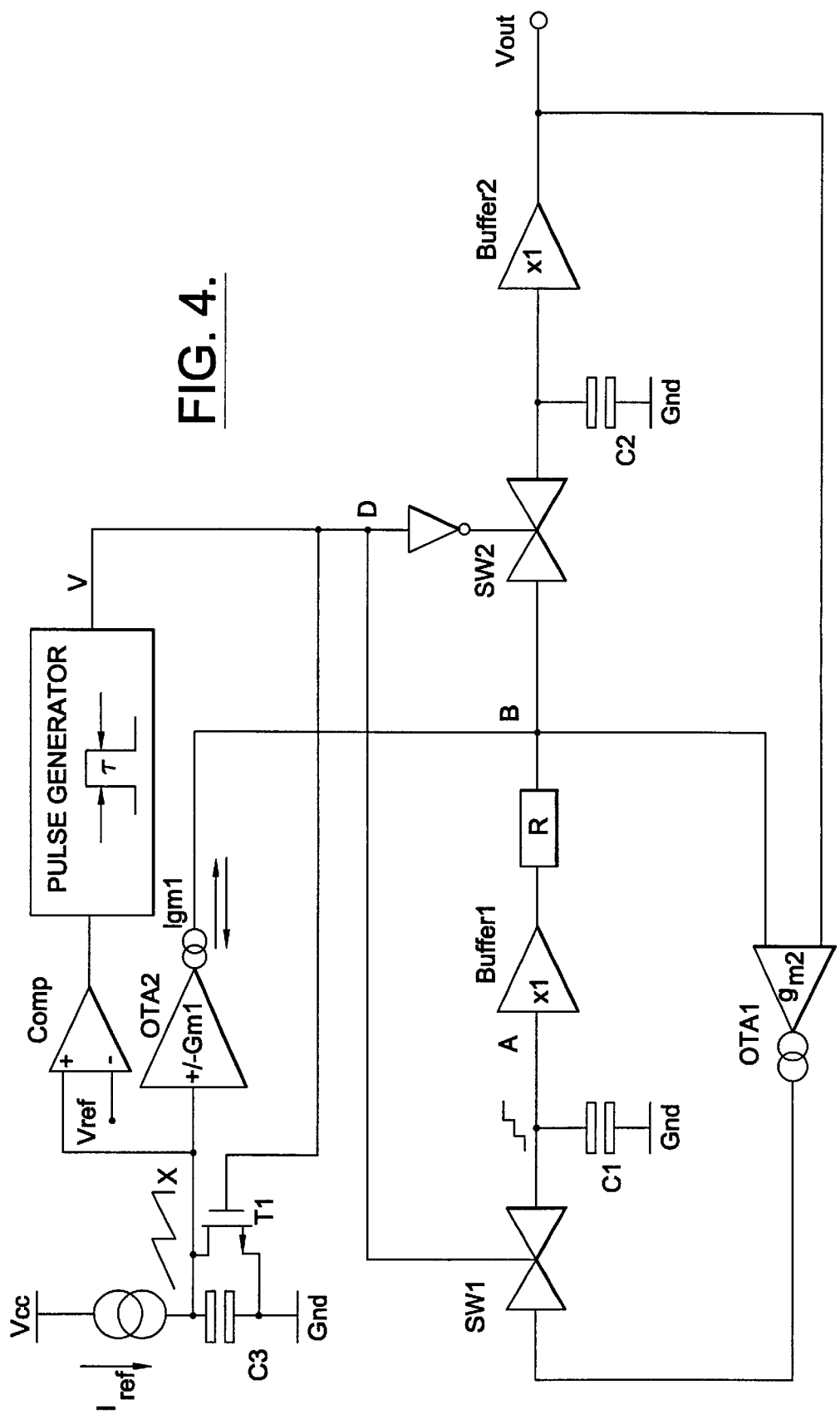
FIG. 4 is a more detailed diagram of the circuit of the invention.

A preferred embodiment of the circuit of the invention is depicted in FIG. 4. The block GENERATORS comprises a linear voltage ramp generator, realized by a constant current generator $I_{REF}$ charging a capacitor C3. A comparator $C_{OMP}$ has a noninverting input coupled to the capacitor C3 and an inverting input coupled to a reference voltage $V_{REF}$ and produces a flag signal each time the voltage ramp on the capacitor C3 exceeds the reference voltage. A pulse generator produces the pulse signal V of fixed duration at each assertion of the flag signal. A discharge switch T1 is connected in parallel to the capacitor C3 and is controlled by the pulse signal V, short-circuiting C3 during each a pulse of fixed duration. On the capacitor C3 there will be a periodic triangular voltage signal that is converted in the periodic triangular current signal $I_{GM1}$ by the operational transconductance amplifier OTA2.

The circuit of the invention allows for the programming of the slope of the output voltage ramp $V_{OUT}$ in a broad range, by adjusting the parameters of the circuit while requiring a voltage ramp generator with a relatively steep slope which is therefore more easily integratable. Moreover, no particularly demanding offset voltage characteristics of the two buffers employed, Buffer1 and Buffer2, are needed because these offsets may cause only negligible variations of the output ramp $V_{OUT}$.

The fully integrated circuit of the invention eliminates the need of externally connected components for generating slow voltage ramps. It requires the integration of relatively small capacitance and a constant current generator of a not excessively small current.

That which is claimed is:

1. An integrated circuit for generating a voltage ramp comprising:
   a first circuit for generating a periodic triangular current signal with a relatively steep slope;
   a second circuit for generating, at a beginning of each period of the triangular current signal, a pulse having a smaller duration than the period of the triangular current signal; and
   a control loop for generating the voltage ramp and comprising
      an input node for receiving the triangular current signal,
      an output node for outputting the voltage ramp,
      a first switch controlled by the pulse,
      a first hold circuit coupled to said input node via the first switch and comprising a first storage capacitor,
      a transconductance operational amplifier having inputs respectively coupled to said input node and to said output node,
      a second switch controlled by the pulse in phase opposition to said first switch,
      a second hold circuit coupled to an output of said transconductance operational amplifier via the second switch, and
      a resistor connected between an output of said second hold circuit and said input node and having a smaller value than a ratio between the period of the triangular current signal and a capacitance of the first storage capacitor.

2. The integrated circuit according to claim 1 wherein said first circuit for generating the periodic triangular current signal comprises a generator of a periodic triangular voltage signal, and a second transconductance operational amplifier connected to said generator for outputting the triangular current signal.

3. The integrated circuit according to claim 2 wherein said second circuit comprises a voltage comparator for comparing the periodic triangular voltage signal with a reference voltage, and for producing a flag signal each time the triangular voltage signal exceeds the reference voltage, and a pulse generator for producing the pulse based upon the flag signal.

4. The integrated circuit according to claim 2, wherein said generator of the periodic triangular voltage comprises:
   a capacitor;
   a constant current generator for charging said capacitor; and
   a switch connected in parallel to said capacitor and having a control node coupled to an output of said pulse generator for short-circuiting said capacitor during each pulse.

5. An integrated circuit for generating a voltage ramp comprising:
   a first circuit for generating a periodic triangular current signal;
   a second circuit for generating a pulse based upon the triangular current signal; and
   a control loop for generating the voltage ramp and comprising
      an input node for receiving the triangular current signal, an output node for outputting the voltage ramp,
a first switch controlled by the pulse,
a first hold circuit coupled to said input node via the first switch,
an amplifier for receiving the triangular current signal and the voltage ramp,
a second switch controlled by the pulse in phase opposition to said first switch,
a second hold circuit coupled to an output of said operational amplifier via the second switch, and
a resistor connected between an output of said second hold circuit and said input node.

6. The integrated circuit according to claim 5 wherein the pulse has a smaller duration than a period of the triangular current signal.

7. The integrated circuit according to claim 5 wherein the first hold circuit comprises a first storage capacitor; and wherein the resistor has a smaller value than a ratio between the period of the triangular current signal and a capacitance of the first storage capacitor.

8. The integrated circuit according to claim 5 wherein said first hold circuit comprises a first storage capacitor and a first buffer; and wherein the second hold circuit comprises a second storage capacitor and a second buffer.

9. The integrated circuit according to claim 5 wherein said first circuit comprises a periodic triangular voltage signal generator, and an amplifier connected to said periodic triangular voltage signal generator for outputting the triangular current signal.

10. The integrated circuit according to claim 9 wherein said second circuit comprises a pulse generating circuit for producing the pulse based upon a comparison between the periodic triangular voltage signal and a reference voltage.

11. The integrated circuit according to claim 10 wherein said pulse generating circuit comprises a voltage comparator for comparing the periodic triangular voltage signal with the reference voltage, and for producing a flag signal each time the triangular voltage signal exceeds the reference voltage, and a pulse generator for producing the pulse based upon the flag signal.

12. The integrated circuit according to claim 9, wherein said periodic triangular voltage generator comprises:
a capacitor;
a constant current generator for charging said capacitor; and
a switch connected in parallel to said capacitor and controlled by the pulse.

13. A method of generating a voltage ramp comprising:
generating a periodic triangular current signal;
generating a pulse based upon the triangular current signal; and
generating the voltage ramp based upon the triangular current signal and the pulse with a control loop comprising
an input node for receiving the triangular current signal,
an output node for outputting the voltage ramp,
a first switch controlled by the pulse,
a first hold circuit coupled to the input node via the first switch,
an amplifier for receiving the triangular current signal and the voltage ramp,
a second switch controlled by the pulse in phase opposition to the first switch,
a second hold circuit coupled to an output of the operational amplifier via the second switch, and
a resistor connected between an output of the second hold circuit and the input node.

14. The method according to claim 13 wherein the pulse has a smaller duration than a period of the triangular current signal.

15. The method according to claim 13 wherein the first hold circuit comprises a first storage capacitor; and wherein the resistor has a smaller value than a ratio between the period of the triangular current signal and a capacitance of the first storage capacitor.

16. The method according to claim 13 wherein said first hold circuit comprises a first storage capacitor and a first buffer; and wherein the second hold circuit comprises a second storage capacitor and a second buffer.

17. The method according to claim 13 wherein the triangular current signal is generated by a first circuit comprising a periodic triangular voltage signal generator and a second operational amplifier connected thereto.

18. The method according to claim 17 wherein the pulse is based upon a comparison between the periodic triangular voltage signal and a reference voltage.

19. The method according to claim 18 wherein generating the pulse comprises:
producing a flag signal each time the triangular voltage signal exceeds the reference voltage; and
producing the pulse based upon the flag signal.

20. The method according to claim 17, wherein said periodic triangular voltage generator comprises:
a capacitor;
a constant current generator for charging said capacitor; and
a switch connected in parallel to said capacitor and controlled by the pulse.

* * * * *